Figure 1:
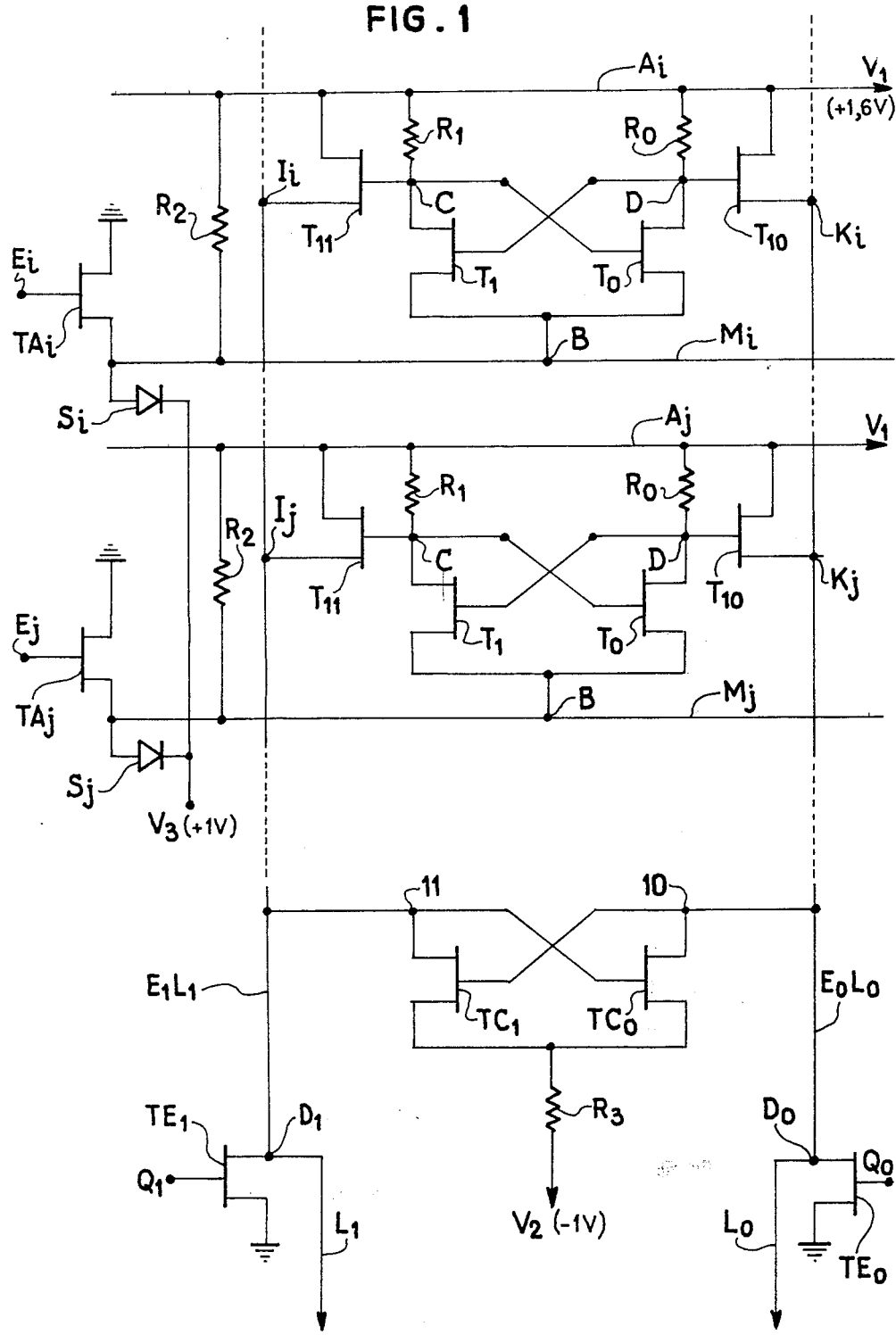

United States Patent [19]
Bert

[11] 3,955,182
[45] May 4, 1976

[54] TRANSISTORISED MEMORY CELL AND AN INTEGRATED MEMORY USING SUCH A CELL

[75] Inventor: Georges Bert, Paris, France

[73] Assignee: Thomson-CSF, Paris, France

[22] Filed: Mar. 21, 1975

[21] Appl. No.: 560,864

[30] Foreign Application Priority Data
Mar. 26, 1974 France .............................. 74.10299

[52] U.S. Cl. ............................ 340/173 FF; 307/291
[51] Int. Cl.² ......................................... G11C 11/40
[58] Field of Search ............... 340/173 FF; 307/238, 307/289, 291

[56] References Cited
UNITED STATES PATENTS
3,633,182  1/1972  Koo ................................ 340/173 FF
3,668,656  6/1972  Hoggar ......................... 340/173 FF OTHER PUBLICATIONS
Palfi, Bilevel Powered FET Memory Cell, IBM Technical Disclosure Bulletin, Vol. 14, No. 1, 6/71, pp. 261–262.

Primary Examiner—Stuart N. Hecker
Attorney, Agent, or Firm—Cushman, Darby & Cushman

[57] ABSTRACT

A memory cell as required for use in the building of integrated memories, which contains bistable trigger stages formed by two transistors, with a high operational reliability, a low power consumption and an access time of less than 0.01 microseconds for a store of 64 elements, is provided. To this end, low-consumption field-effect transistors are chosen, obtained by the ion implantation of an N-type channel, in order, in each cell, to form, in addition to the two transistors of the trigger stage, a pair of transistors connected as amplifier-followers. The selection of a cell is effected by raising the potential on the word line connected to the sources of the transistors of the trigger stage.

4 Claims, 3 Drawing Figures

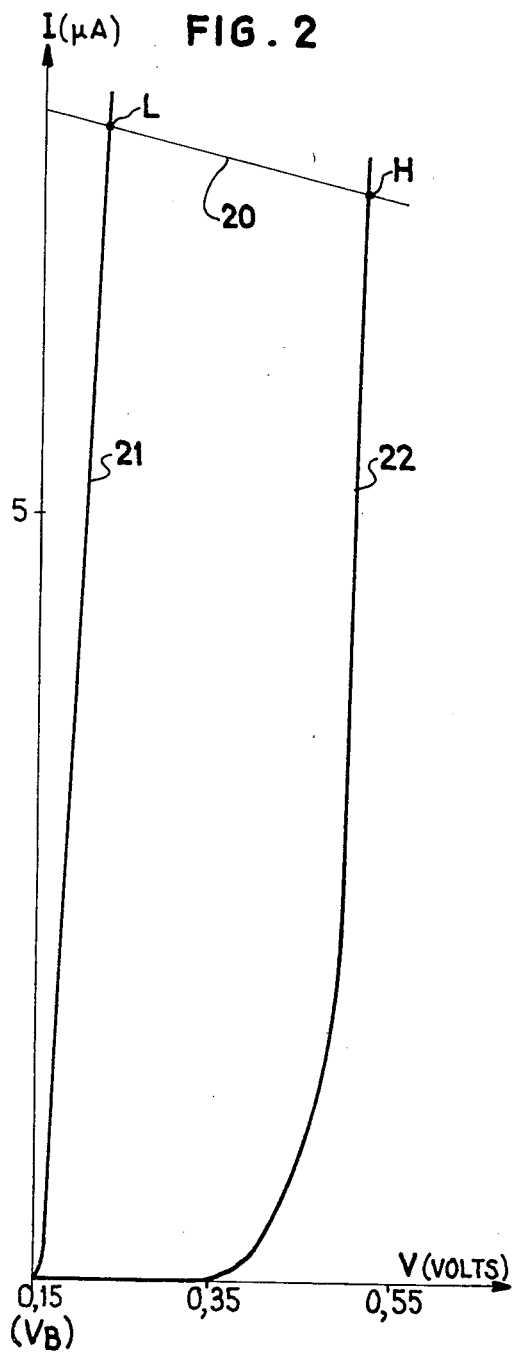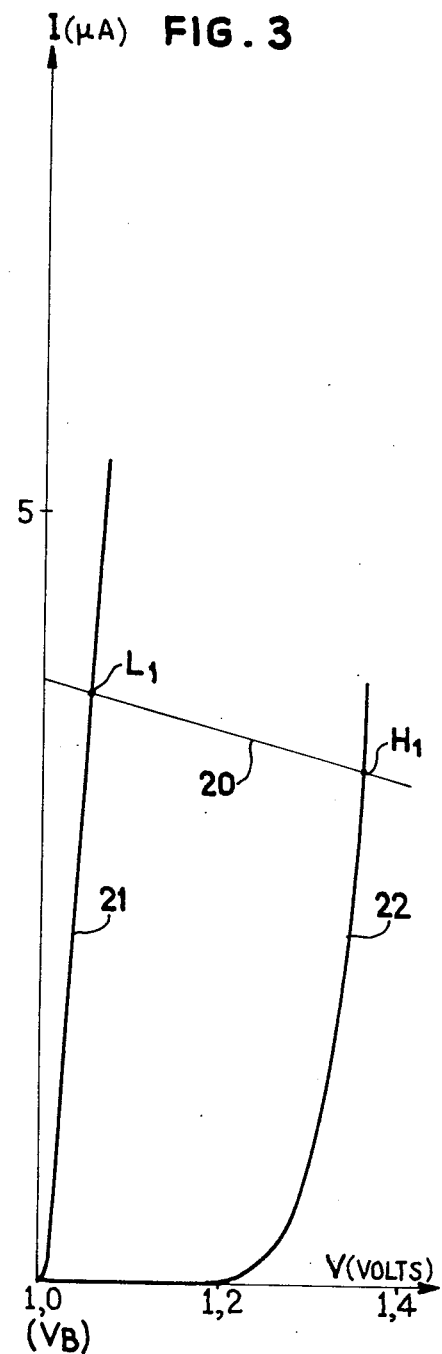

TRANSISTORISED MEMORY CELL AND AN INTEGRATED MEMORY USING SUCH A CELL

The present invention relates to a transistorised memory cell and to an integrated memory using such a cell. Those skilled in the art will be aware that in a semi-conductor memory the data are stored in binary form (bits) in elements which constitute the basic cells and which are capable of acquiring either a 1 or 0 state. Each cell can comprise more than one component integrated into the same semi-conductor substrate, for example two transistors connected to form a logic trigger stage of bistable kind, and two other components which translate the write-in pulses into control pulses for controlling the trigger, or the potentials which characterize 1 or 0 states into read-out pulses.

The cells arranged in p rows and q columns, and formed on one and the same wafer of semi-conductor material, for example silicon, form and integrated memory comprising pq cells.

These memories are open to a drawback, likewise in the case where cells employing trigger stages are used although these latter produce extremely reliable signals. The drawback arises from the fact that the write-in/read-out lines have a relatively substantial distributed capacitance and this attenuates the high speed read-out signals.

The invention reduces the degree of this drawback.

According to the present invention, a transistorised memory cell, comprising a first and a second field-effect transistors constituting a logic trigger stage of bistable design with two inputs/outputs and having their sources connected to one and the same word line, a third and a fourth field-effect transistors respectively connected as amplifier-followers, their gates being connected respectively to each of said inputs/outputs, and their sources being connected respectively to a first and a second write-in/read-out line.

The invention will be better understood and other of its features will become apparent, from a consideration of the ensuing description and the accompanying drawings in which:

FIG. 1 schematically illustrates part of an integrated memory, offered by way of example, and comprising cells in accordance with the invention;

FIGS. 2 and 3 are explanatory graphs.

FIG. 1 schematically illustrates part of an integrated memory constituting an example of the invention, the drawing being limited here to two cells arranged in one and the same column, and to certain components or connections which serve a row or column of the memory.

Two write-in/read-out lines $E_1L_1$ and $E_oL_o$ belong to the column containing the chosen cells and these lines are connected to them at the points $I_i$ and $K_i$ in the case of the cell $i$, and at the points $I_j$ and $K_j$ in the case of the cell $j$. The references of the components of each cell are marked in an identical way. In respect of each of these cells, there are two transistors $T_1$ and $T_o$ connected as a trigger stage, or, to be more specific:

whose sources are connected to a point B in a word line (or address line) $M_i$ or $M_j$;

whose gates and drains are connected in crossed fashion to the points C (drain of $T_1$, gate of $T_o$) and D (drain of $T_o$, gate of $T_1$);

and whose drains are supplied, across a resisting load of 200,000 ohms, $R_1$ or $R_o$, by a line $A_i$ or $A_j$ connected to a constant voltage source $V_1$ (+ 1.6 volts). The points C and D are respectively connected to the gates of the transistors $T_{11}$ and $T_{10}$ whose drains are connected to the line $A_i$ (or $A_j$) without any resistive load, and the sources to the points of connection $I_i$ and $K_i$ (or $I_j$ and $K_j$) with the write-in/read-out lines.

The word line $M_i$ (or $M_j$) is supplied by the line $A_i$ (or $A_j$) across a resistor $R_2$ of 10,000 ohms. Its potential depends upon an address transistor $TA_i$ (or $TA_j$) whose channel is arranged between the line and earth, and whose gate is connected to an address input $E_i$ (or $E_j$).

The word line potential must not exceed 1 volt and this limit is imposed by means of a diode $(S_i)$ or $(S_j)$ connected between the line $M_i$ (or $M_j$) and the positive terminal $V_3$ (+ 1 volt) of a direct voltage source.

The write-in/read-out lines $E_1L_1$ and $E_oL_o$ of the column of cells illustrated, are supplied by a so-called "mutual feedback" system constituted by two transistors $TC_1$ and $TC_o$ connected as a trigger stage between the points 10 (drain of $TC_o$) and 11 (drain of $TC_1$), with the interposition of a resistor $R_3$, of around 60,000 ohms, in series between the common source of the two transistors and the negative terminal of a direct supply source $V_2$ (− 1 volt). The point 10 is connected to the line $E_oL_o$ and the point 11 to the line $E_1L_1$.

At the points $D_1$ (connected to the point 11) and $D_o$ (connected to the point 10) the write-in/read-out lines split into read-out lines $L_1$ and $L_o$ connected to two terminals of a read-out amplifier which has not been shown, on the one hand, and on the other to the write-in inputs, each equipped with a write-in transistor. These transistors $TE_1$ and $TE_o$ have their channels connected between $D_1$ and earth and $D_o$ and earth, respectively. Their gates constitute the inputs $Q_1$ and $Q_o$ of the column in question.

The operation of the memory is as follows:

a. read-out:

A column is selected by choice of the pair of read-out lines $L_1$ and $L_o$ and the relevant cell in the column is selected by application of a negative potential to the input $E_i$ of the transistor $TA_i$ in the word line $M_i$ serving the selected cell. The transistor $TA_i$ blocks and the potential at the point B rises for example from 0.15 volts to 1 volt in the example in question.

The potentials at the points D and C are fixed:

in the case of a conductive transistor, by the saturation current of the latter, taking into account the resistive load on the drain;

in the case of a blocked transistor, by the diode current flowing across the diode constituted by the "gate-channel" junction of the field-effect transistor $T_1$ or $T_o$, taking into account the resistive load on the gate.

FIGS. 2 and 3 illustrate the saturation currents (on the ordinates) and the gate currents (likewise on the ordinates) as a function of the potential difference (on the abscissae) between the points C (or D as the case may be) and the point B, the origin of the abscissae being taken at the point $V = V_B$. The graph 21 illustrates the drain current I of the transistor in the conductive state, as a function of this potential difference. The graph 22 illustrates the current through the gate-channel junction, on the same system of coordinates. The graph 20 is a straight load line which is the same for both the currents being examined, the resistive loads being the same. The graphs of FIGS. 2 and 3 are shifted parallel to the abscissae axis as a function of the rise in the potential at the point B, FIG. 2 relating to the case in which the cell has not been selected and FIG. 3 to the case in which the cell has been selected by addressing through the transistor $TA_t$.

It will be appreciated, from a consideration of FIGS. 2 and 3, that the potentials as the points C and D rise by substantially the same quantity when the point B is shifted from a potential of 0.15 volt (FIG. 2) to a potential of 1 volt (FIG. 3). This is due to the fact that the graphs 21 and 22 have substantially identical slopes at the portions intersected by the straight load lines. The "high" and "low" states of the points C and D are characterized by the abscissae values of the points L and H (around 0.2 and 0.5 volt respectively) in the case of the non-addressed cell, and by those of the points $L_1$ and $H_1$ (around 1.05 and 1.35 volt) in the case of the addressed cell.

Due to the rise in the potentials at the points C and D, the transistors $T_{11}$ and $T_{10}$ allow current to flow in their channels (these are field-effect transistors) but the currents are dissimilar from one another by reason of the potential difference between the points C and D. The result is that there is a potential difference between the lines $E_1L_1$ and $E_oL_o$, reproducing the state of the trigger stage $T_1$, $T_o$.

Because of the potential difference between the points 10 and 11, the trigger stage formed by the transistors $TC_1$ and $TC_o$ adopts a stable position adjusting the voltages on the lines $E_1$ and $L_1$ and $E_oL_o$ to normal values even if the transistors $T_{11}$ and $T_{10}$ have characteristics differing from the normal values, something which sometimes happens in an integrated circuit.

The read-out amplifier, which has not been shown, translates the potential difference between the lines $L_1$ and $L_o$, into processible signals.

b. Write-in:

In order to write a 1 in (assuming that this logic state corresponds to a low potential on the line $L_1$ and at the point C), a positive pulse is supplied to the input terminal $Q_1$ of the transistor $TE_1$, driving the latter conductive and producing a voltage drop on the line $E_1L_1$. The result is a sufficient potential difference between the gate of the transistor $T_{11}$, which gate is connected to the point C, and the source of this same transistor, which is connected to the line $E_1L_1$, for the threshold voltage of the gate-channel junction to be exceeded and for a current to flow through this junction, with the result that the cell changes to the 1 state, or that this state is confirmed if it already existed.

In order to write in a 0, a similar procedure is adopted commencing from the line $E_oL_o$.

In the chosen example, each cell occupies a substrate area equal to a square having a side length of 40 microns. The currents drawn by the field-effect transistors are of the order of 5 to 10 microamps. The N-type channels of these transistors are formed by ion implantation. The access time is of the order of about 10 nano-seconds for a memory having a capacity of 64 bits (8 columns with 8 memory cells).

What we claim is:

1. A transistorised memory cell, comprising a first and a second field-effect transistors constituting a logic trigger stage of bistable design with two inputs/outputs and having their sources connected to one and the same word line, a third and a fourth field-effect transistors respectively connected as amplifier-followers, their gates being connected respectively to each of said inputs/outputs, and their sources being connected respectively to a first and a second write-in/read-out line.

2. A memory comprising $pq$ cells (where $p$ and $q$ are whole numbers) as claimed in claim 1 said cells being formed on one and the same semi-conductor substrate.

3. A memory as claimed in claim 2, wherein said word lines are connected across a resistor to a first direct supply terminal also supplying the drains of the amplifier transistors of the differing elements, each of them being alternately earthed and isolated from earth through the medium of the channel of an address transistor of field-effect type, integrated into the same substrate as the rest of the memory.

4. A memory as claimed in claim 3, wherein the two write-in/read-out lines of each column of cells, are furthermore connected, across a resistive load, to a second supply terminal of opposite sign to the first, each of them being alternately earthed and insulated from earth through the medium of the channel of a transistor of field-effect type, integrated into the same substrate as the rest of the memory.

* * * * *